(12) United States Patent
Lee et al.

(10) Patent No.: US 6,501,655 B1
(45) Date of Patent: Dec. 31, 2002

(54) HIGH PERFORMANCE FIN CONFIGURATION FOR AIR COOLED HEAT SINKS

(75) Inventors: Seri Lee, Beaverton; Lloyd L. Pollard, II, Portland, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/716,877

(22) Filed: Nov. 20, 2000

(51) Int. Cl.⁷ .............................................. H05K 7/20
(52) U.S. Cl. ........................ 361/703; 165/80.3; 257/722; 361/719
(58) Field of Search ................. 454/184; 257/722; 174/16.3; 165/80.3, 185; 361/687, 703, 704, 705, 717–719

(56) References Cited

U.S. PATENT DOCUMENTS

| | | | |
|---|---|---|---|
| 3,239,003 A | 3/1966 | Boudette et al. | 165/185 |
| 4,354,729 A | 10/1982 | Grabbe et al. | 339/258 R |
| 4,557,225 A * | 12/1985 | Sagues et al. | 123/41.31 |
| 4,645,279 A | 2/1987 | Grabbe et al. | 339/17 CF |
| 4,699,593 A | 10/1987 | Grabbe et al. | 439/71 |
| 4,726,739 A | 2/1988 | Saitou et al. | 417/286 |
| 4,940,432 A | 7/1990 | Consoli et al. | 439/862 |
| 4,959,029 A | 9/1990 | Grabbe | 439/862 |
| 5,035,629 A | 7/1991 | Matsuoka | 439/70 |
| 5,132,875 A | 7/1992 | Plesinger | 361/386 |
| 5,286,208 A | 2/1994 | Matsuoka | 439/72 |
| 5,375,652 A | 12/1994 | Matsunaga et al. | 165/80.3 |
| 5,437,327 A | 8/1995 | Chiou | 165/122 |
| 5,545,045 A | 8/1996 | Wakamatsu | 439/70 |
| 5,567,983 A | 10/1996 | Hirano et al. | 257/722 |
| 5,704,416 A | 1/1998 | Larson et al. | 165/104.33 |
| 5,785,116 A | 7/1998 | Wagner | 165/80.3 |
| 5,800,184 A | 9/1998 | Lopergolo et al. | 439/66 |
| 5,975,194 A | 11/1999 | Wagner | 165/80.3 |
| 6,075,285 A | 6/2000 | Taylor et al. | 257/691 |
| 6,075,702 A * | 6/2000 | Gardner et al. | 361/704 |
| 6,152,214 A | 11/2000 | Wagner | 165/121 |
| 6,176,299 B1 | 1/2001 | Hanzlik et al. | 165/80.3 |
| 6,189,601 B1 * | 2/2001 | Goodman et al. | 165/80.3 |
| 6,208,511 B1 * | 3/2001 | Bortolini et al. | 361/698 |
| 6,219,239 B1 * | 4/2001 | Mellberg et al. | 361/704 |

FOREIGN PATENT DOCUMENTS

| | | | |
|---|---|---|---|
| EP | 1081760 | 3/2001 | H01L/23/467 |
| JP | 406077677 A * | 3/1994 | |

OTHER PUBLICATIONS

Cotton, M., "Microfeatures & Embedded Coaxial Technology", *Electronic Circuits World Convention* 86p., (Sep. 8, 1999).

* cited by examiner

Primary Examiner—Gerald Tolin
(74) Attorney, Agent, or Firm—Schwegman, Lundberg, Woessner & Kluth, P.A.

(57) ABSTRACT

A heat dissipation system and method for extracting heat from an integrated circuit device includes, in one example embodiment, a thermally conductive base plate. The heat dissipation system and method further includes an array of substantially parallel fin structures having top and bottom portions. The thermally conductive base plate is attached to the array such that the thermally conductive base plate is in close proximity to the bottom portion. The top and bottom portions extend outwardly from the thermally conductive base plate. The top portion of the array further extends laterally beyond the bottom portion of the array. The top and bottom portions of the array are of sufficient size so as to allow components on a motherboard to encroach around the integrated circuit device.

12 Claims, 6 Drawing Sheets

HIGH PERFORMANCE FIN CONFIGURATION FOR AIR COOLED HEAT SINKS

TECHNICAL FIELD

This invention relates generally to a heat dissipation system and method for an integrated circuit assembly, and more particularly to a system and method of dissipating heat from an integrated circuit device.

BACKGROUND

Integrated circuit devices, microprocessors and other related computer components are becoming more and more powerful with increasing capabilities, resulting in increasing amounts of heat generated from these components. Packaged units and integrated circuit device sizes of these components are decreasing or remaining the same, but the amount of heat energy given off by these components per unit volume, mass, surface area or any other such metric is increasing. In current packaging techniques, heat sinks typically consist of a flat base plate, which is mounted on to the integrated circuit device on one side. The heat sinks further include an array of fins running perpendicular to the flat base plate on the other side. Generally, the integrated circuit devices (which are the heat sources) have a significantly smaller footprint size than the flat base plate of the heat sink. The flat base plate of the heat sink has a large footprint, that is requires more motherboard real estate than the integrated circuit device in contact there with. The larger size of the base plate causes the outermost part of the base plate that is not directly in contact with the integrated circuit device to have a significantly lower temperature than the part of the base plate that is directly in contact with the integrated circuit device. Furthermore, as computer-related equipment becomes more powerful, more components are being placed inside the equipment and on the motherboard which further requires more motherboard real estate. In addition, the base plate of prior art heat sink designs is at the same level as the integrated circuit device to which it is attached. Consequently, the flat base plate configuration of the heat sink generally ends up consuming more motherboard real estate than the integrated circuit device on which it is mounted. As a result, the larger footprint size of the base plate prevents other motherboard components, such as low-cost capacitors, from encroaching around or on the microprocessor. Thus, the large amounts of heat produced by many of such integrated circuits, and the increasing demand for motherboard real estate need to be taken into consideration when designing the integrated circuit mounting and packaging devices.

For the reasons stated above, and for other reasons stated below which will become apparent to those skilled in the art upon reading and understanding the present specification, there is a need in the art for a low-mass enhanced heat dissipation device and method that do not consume more motherboard real estate than the integrated circuit device to which it is attached, to accommodate low-cost electronic components needing to encroach on the microprocessor.

DETAILED DESCRIPTION

Figure 1:
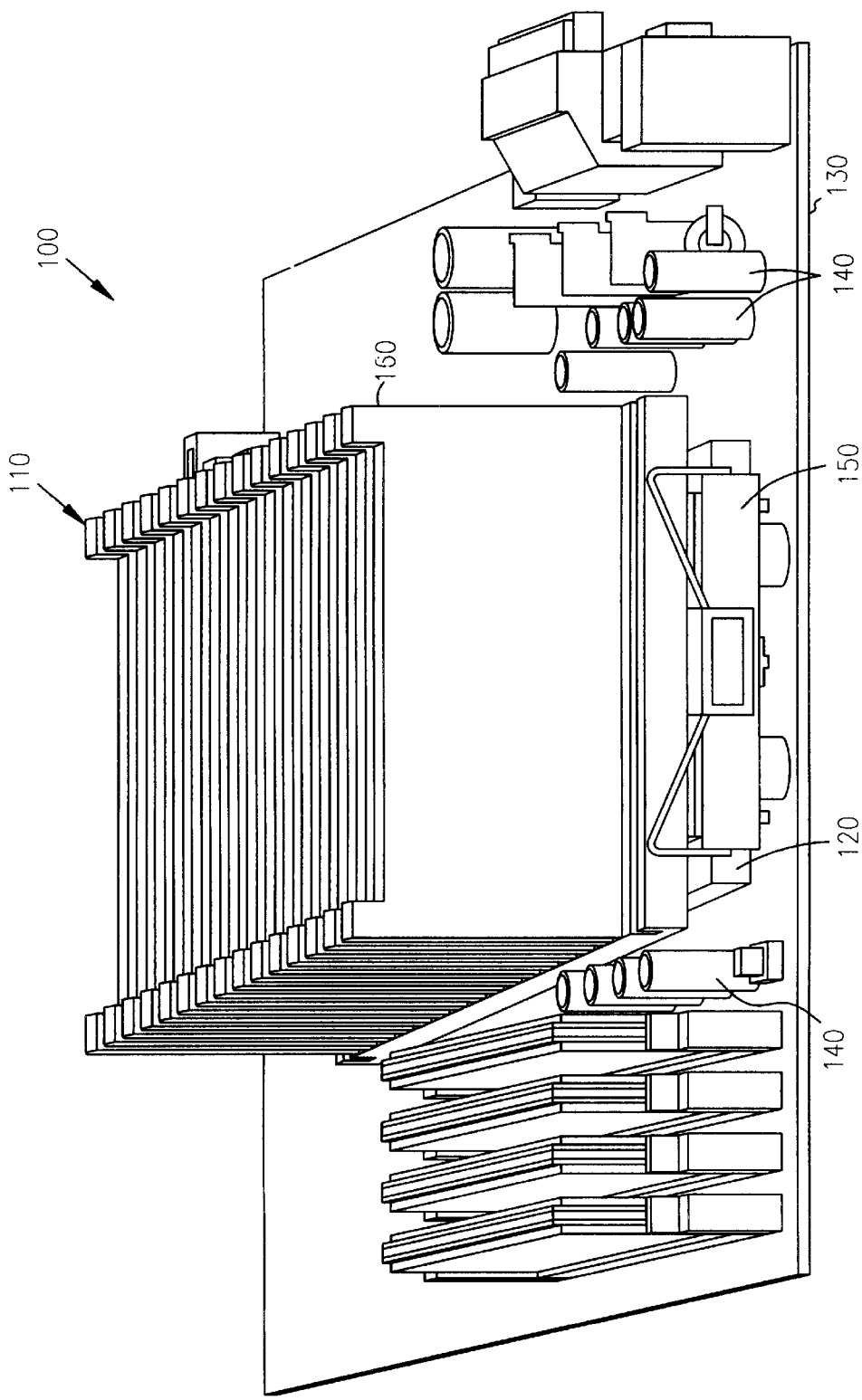
FIG. 1 is an isometric view of a prior art heat sink attached to a microprocessor mounted on an assembled printed circuit board.

In the following detailed description of the embodiments, reference is made to the accompanying drawings that illustrate the present invention and its practice. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included in other embodiments. The following detailed description is, therefore, not to be taken in a limiting sense, and the scope of the present invention is defined only by the appended claims, along with the full scope of equivalents to which such claims are entitled.

This document describes, among other things, an enhanced heat dissipation device that allows electronic components to encroach on to the microprocessor while maintaining high performance and cost effectiveness by leveraging currently enabled high-volume manufacturing techniques.

FIG. 1 shows an isometric view 100 of a prior art heat sink 110 mounted on a microprocessor 120 of an assembled mother board 130. Also, shown in FIG. 1 are low-cost capacitors 140 mounted around the heat sink 110 and on the mother board 130.

The prior art heat sink 100 has a flat base plate 150 including an array of fins 160 extending perpendicularly away from the flat base plate 150. This configuration of the heat sink 110 dictates the use of the flat base plate 110, with the array of fins 160 for dissipating heat from the microprocessor 120. Increasing the heat dissipation using the prior art heat sink 110 shown in FIG. 1, generally requires enlarging the surface area of the flat base plate 150 and/or the array of fins 160. This in turn results in consuming more motherboard real estate. Generally, the microprocessor 120 (which is the heat source) have a smaller footprint size than the flat base plate 150 configuration of the heat sink 110 shown in FIG. 1. A larger footprint size of the flat base plate 150 can cause the outermost part of the flat base plate 150 (the portion that is not directly in contact with the integrated circuit device) to have a significantly lower temperature than the part of the flat base plate 150 that is directly in contact with the integrated circuit device. Consequently, the prior art heat sink 110 with the larger flat base plate 150 is not effective in dissipating heat from the integrated circuit device. Furthermore, the packaged units and integrated circuit device sizes are decreasing, while the amount of heat generated by these components is increasing. The prior art heat sink 110 configuration dictates that the array of fins 160 extend to the edge of the flat base plate 150 to extract heat from the integrated circuit device. Also, the prior art heat sink 110 requires increasing the size of the array of fins 160 to increase the heat dissipation. In order to enlarge the fins 120 laterally, the flat base plate 150 has to increase in size. Enlarging the flat base plate 150 consumes more motherboard real estate. Consuming more motherboard real estate is generally not a viable option in an environment where system packaging densities are increasing with each successive, higher performance, integrated circuit device generation. Also, the flat base plate 110 configuration of the prior art heat sink 100 has a larger footprint size than the integrated circuit device on which it is mounted (the flat base plate 110 is at the same level as the integrated circuit device it is mounted on), motherboard components, such as low-cost capacitors, are prevented from encroaching on and around the integrated circuit device.

Figure 2:
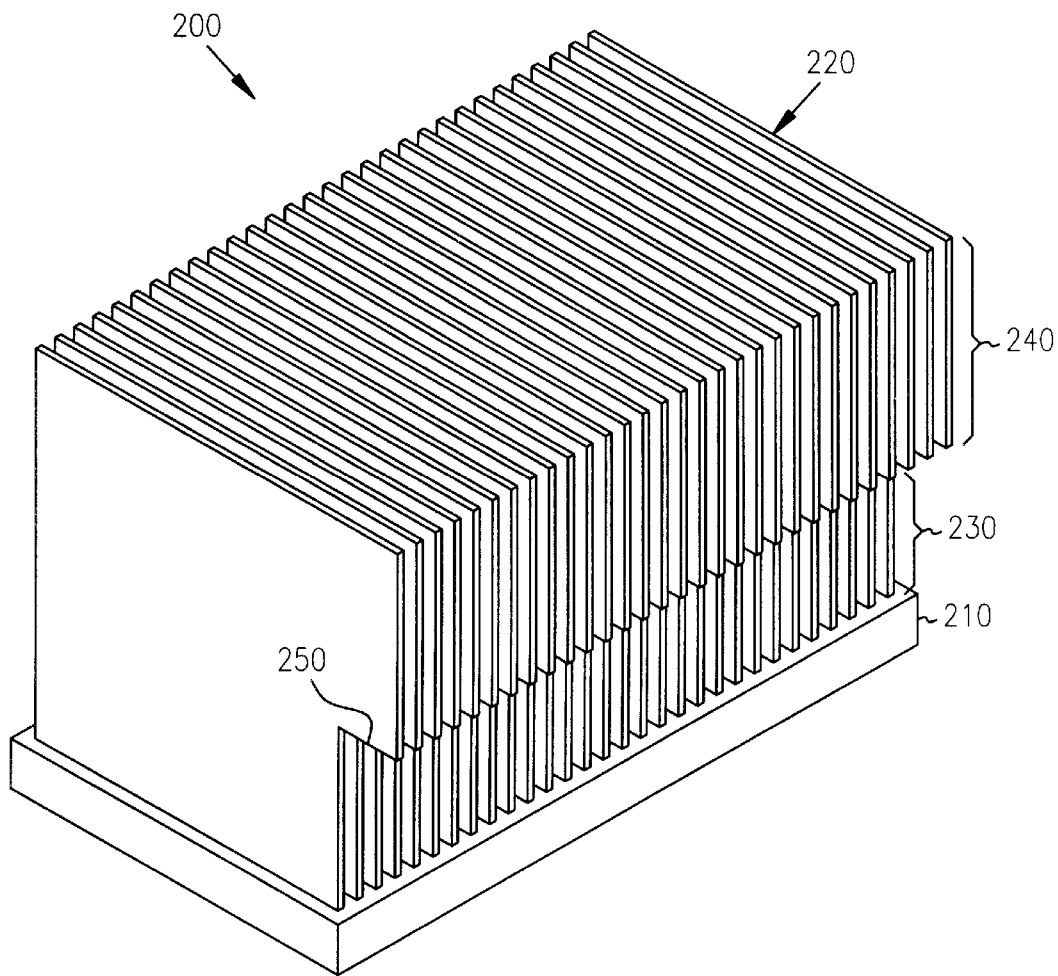
FIG. 2 is an isometric view of one embodiment of a heat dissipation device according to the present invention.

FIG. 2 is an isometric view of the heat dissipation device 200 according to one embodiment of the present invention. The heat dissipation device 200 shown in FIG. 2 includes a thermally conductive base plate 210, and an array of substantially parallel fin structures 220 attached to the thermally conductive base plate 210. The array 220 extends outwardly 250 from the thermally conductive base plate 210 where possible to enhance heat dissipation. In some embodiments, the array 220 extends outwardly in a vertical direction from the thermally conductive base plate 210. Also in some embodiments, the array 220 extends outwardly from the thermally conductive base plate 210 such that the array 220 allows components mounted on a printed circuit board to encroach around an integrated circuit device when the heat dissipation device 200 is mounted on the integrated circuit device.

In the embodiment shown in FIG. 2, the array 220 includes a bottom portion 230 and a top portion 240. The thermally conductive base plate 210 is attached to the array 220 such that the bottom portion 230 of the array 220 is in close proximity with the thermally conductive base plate 210. The top and bottom portions 240 and 230 of the array 220 extend outwardly from the thermally conductive base plate 210. In some embodiments, the top and bottom portions 240 and 230 extend outwardly from the thermally conductive base plate 210 in a vertical direction. Also, the top portion 240 further extends laterally 250 beyond the bottom portion 230 of the array 220 such that the top and bottom portions 240 and 230 allow components on the printed circuit board to encroach around the integrated circuit device when the heat dissipation device 200 is mounted on the integrated circuit device. In some embodiments, the laterally extending top portion 250 overhangs from the bottom portion 230 to allow the components to encroach around the integrated circuit device. Also the top and bottom portions can be of sufficient size to not to mechanically interfere with the components needing to be placed around the integrated circuit device. In some embodiments, the array 220 including the top and bottom portions 240 and 230, extends laterally in a horizontal direction. Also in some embodiments, the laterally extending top portion 250 further extends laterally in a horizontal direction from the bottom portion 230. In the embodiment shown in FIG. 2, the laterally extending top portion is only on one side of the heat dissipation device 200. It can be envisioned that the laterally extending top portion can be all around the bottom portion 230. Also, it can be envisioned that the laterally extending top portion 250 extends beyond the bottom portion 230 wherever an assembled board geometry permits.

In some embodiments, the laterally extending top portion 250 extends laterally, upwardly, and angularly such that the laterally extending top portion 250 overhangs from the bottom portion 230 and over the components encroaching around the integrated circuit device. The shape of the heat dissipation device can be a square or a rectangle. The heat dissipation device 200 can be made from materials such as copper, aluminum, or other such materials capable of dissipating heat away from the integrated circuit device. In some embodiments, the integrated circuit device can be a microprocessor, a digital signal processor, or an application-specific integrated circuit. Computer simulation analysis have shown that heat transfer rates of the heat sink 200 can be increased by about 20 to 40% over the prior art heat sink 110 by including the laterally extending top portion 250 in the heat sink 200. This increase in the heat transfer rate can be achieved by keeping the footprint sizes of the heat sink and the integrated circuit device same so that the components mounted on the printed circuit board can encroach around the integrated circuit device.

Figure 3:
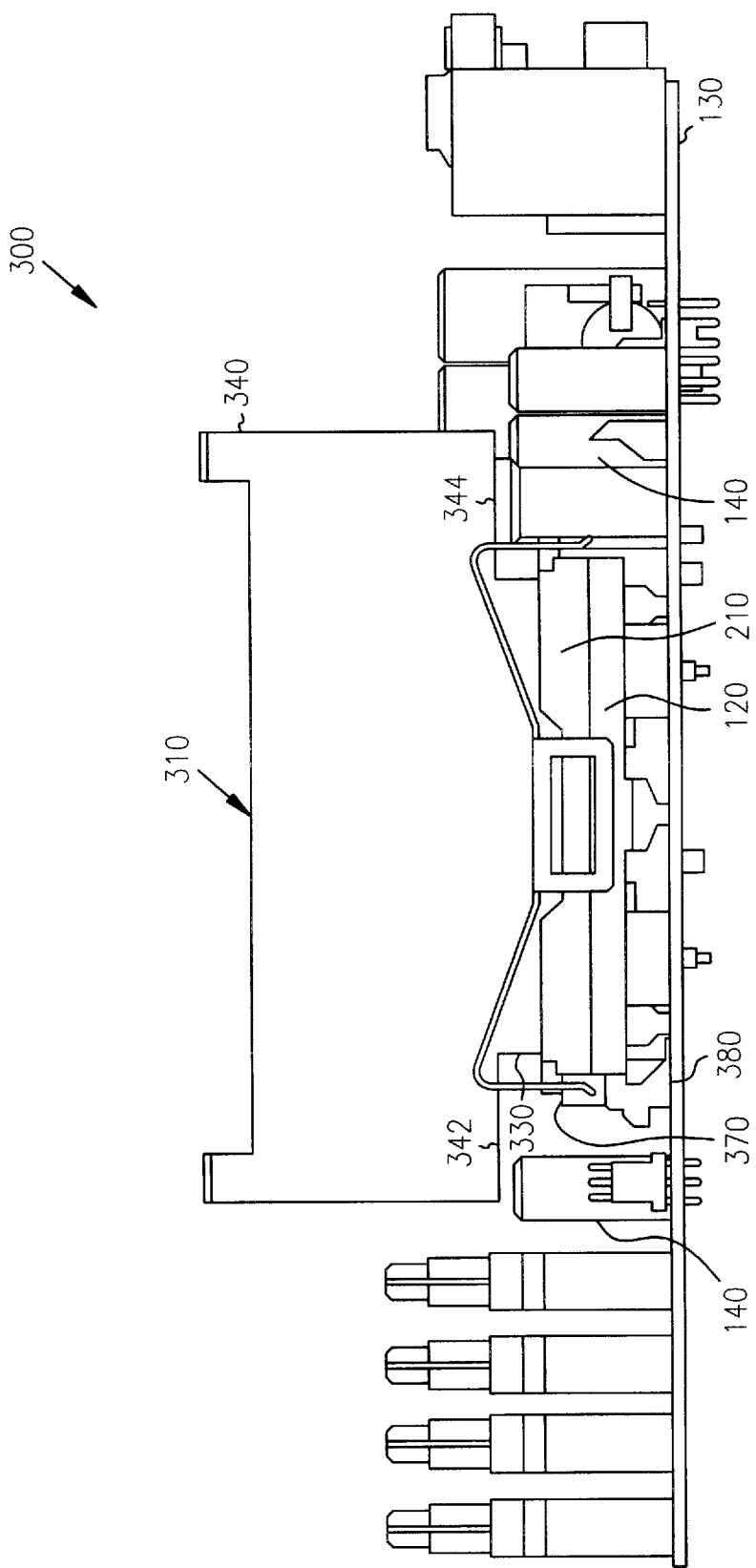
FIG. 3 is a front elevational view of a heat dissipation device according to the present invention attached to the microprocessor mounted on the assembled printed circuit board.

FIG. 3 is a front elevational view 300 of another heat dissipation device 310 according to the present invention attached to a microprocessor 120 mounted on a motherboard 130.

In the embodiment shown in FIG. 3, the microprocessor 120 has a front side 370 and a back side 380. The front side 370 is disposed across from the back side 380. The back side 380 is attached to the motherboard 130. The motherboard 130 shown in FIG. 3, includes components such as low-cost capacitors 140. FIG. 3 also shows the heat sink 300 having top and bottom portions 340 and 330, attached to the front side 370 of the microprocessor 120, such that the bottom portion 230 is in close proximity to the back side 380 of the microprocessor 120.

Also shown in FIG. 3 is the top portion 340 having overhanging regions 342 and 344 disposed across from each other. Also, it can be seen that the overhanging regions 342 and 344 are of sufficient size to allow low-cost capacitors 140 to encroach around the microprocessor 120 and below the top portion 340 of the heat sink 310. The advantage of having overhanging regions 342 and 344, is that they provide additional heat-dissipating fin area to a heat sink without increasing the footprint size of the heat sink. Therefore, inclusion of the overhanging regions 342 and 344 enhances the heat transfer rate from the microprocessor 120 while allowing the low-cost capacitors 140 to encroach around the microprocessor 120. It can be envisioned that the overhanging regions 342 and 344 can be designed to allow any components, other than the low-cost capacitors 140 shown in FIG. 3 to encroach around the microprocessor 120.

Figure 4:
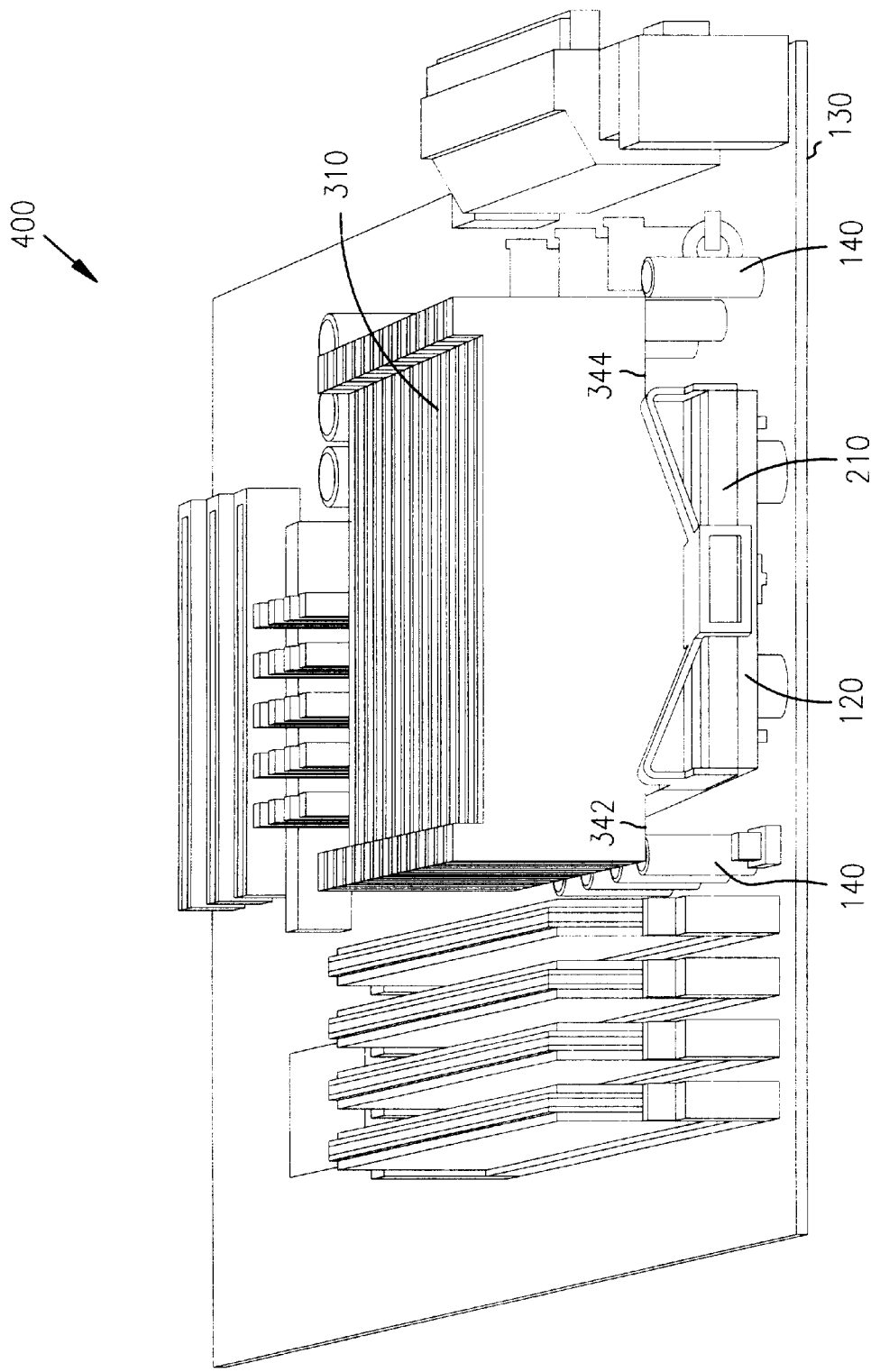
FIGS. 4 and 5 are isometric views of the heat dissipation device attached to the printed circuit board shown in FIG. 3.
Figure 5:
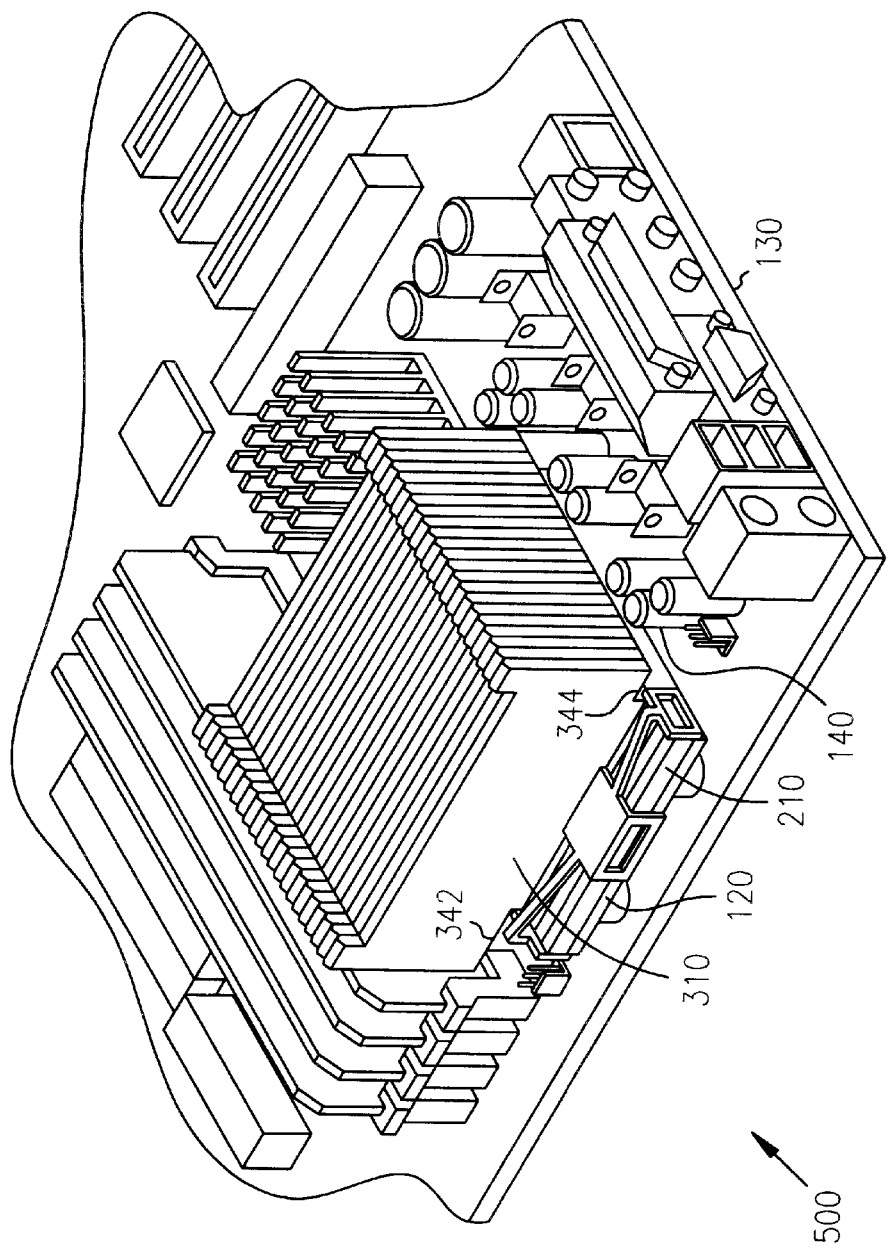

FIGS. 4 and 5 are isometric views 400 and 500 of the embodiment 300 shown in FIG. 3. It can be seen from isometric views 400 and 500 that the footprint of the heat sink 310 and the microprocessor, 120 are the same. It can also be clearly seen from isometric views 400 and 500 that the overhanging regions 340 and 342 of the heat dissipation device 310 allow components such as low-cost capacitors 140 to encroach around the microprocessor 120. Also shown in FIGS. 4 and 5 are the overhanging regions 342 and 344 extending angularly and upwardly from the bottom portion 330 to allow low-cost capacitors 140 to encroach around the microprocessor 120.

Figure 6:
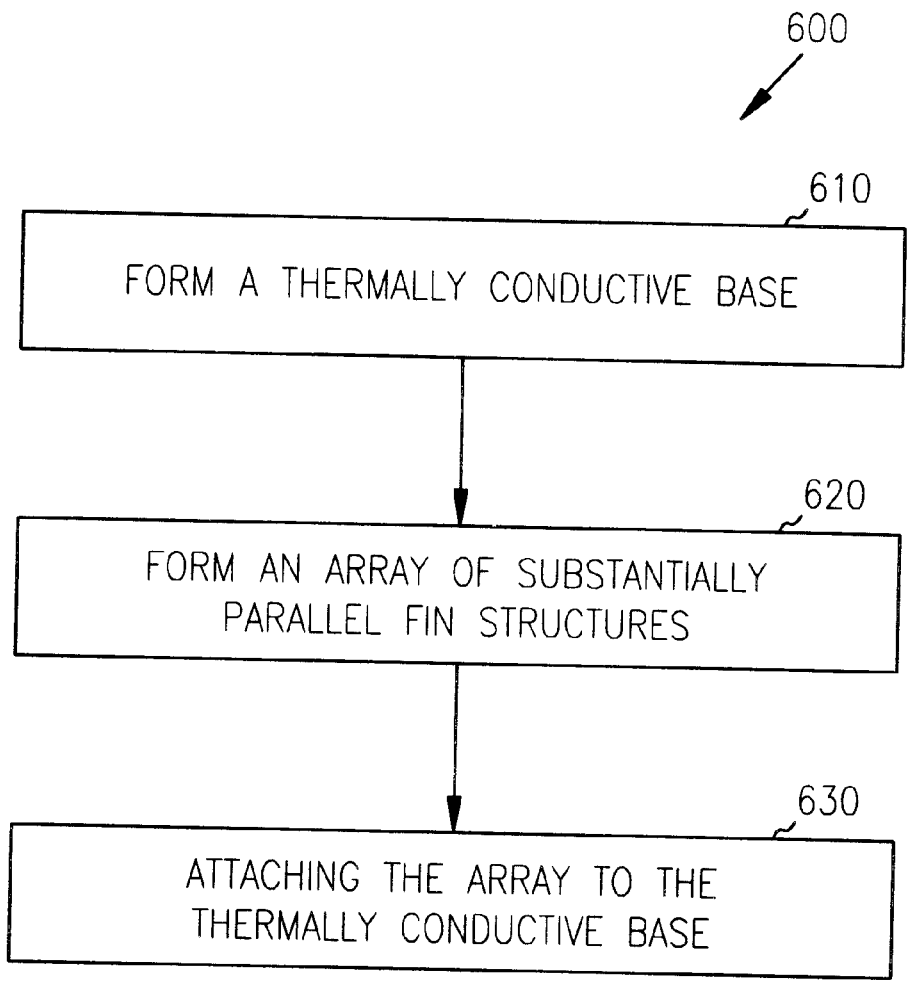
FIG. 6 is a flow diagram of one exemplary method of forming the heat dissipation device of FIG. 2.

FIG. 6 is a flow diagram illustrating generally a method 600 of forming a heat dissipation device to extract heat from an integrated circuit device such the heat dissipation device allows components to encroach around an integrated circuit device. Method 600 as shown in FIG. 6, begins with action 610 of forming a thermally conductive base plate having a footprint size that allows components on the printed circuit board to encroach around the integrated circuit device.

The next action 620 in the method 600 is to form an array of substantially parallel fin structures. The next action 630 includes attaching the array to the thermally conductive base plate such that the array including the thermally conductive base plate allows components on the printed circuit board to encroach on to the integrated circuit device.

The array can include top and bottom portions such that the top portion can extend laterally beyond the bottom portion to allow components to encroach around the integrated circuit device.

The next action can include forming the array such that the top portion extends laterally, upwardly, and angularly beyond the bottom portion of the array. The next action can also include forming the top and bottom portions of the array such that the array extends outwardly from the thermally conductive base plate in a vertical direction, and the array including the laterally extending top portion to laterally extend in the horizontal direction. The next action can also include forming the laterally extending top portion to have overhanging regions that are disposed across from each other. The integrated circuit device can be a microprocessor, a digital signal processor, or a application-specific integrated circuit. The heat dissipation device can be made from materials such as copper, or aluminum.

CONCLUSION

The above-described method and device provides, among other things, an enhanced heat dissipation device that extends fins outwardly from a thermally conductive base plate where possible, to allow electronic components to encroach on to the microprocessor while maintaining high performance and cost effectiveness by leveraging currently enabled high-volume manufacturing techniques.

What is claimed is:

1. A heat dissipation system, comprising:
    an integrated circuit device, having a front side and a back side, wherein the front side is disposed across from the back side, wherein the front side is attached to a printed circuit board having components;
    an enhanced heat dissipation device comprising:
        a thermally conductive base plate, attached to the back side of the integrated circuit device;
        an array of substantially parallel fin structures, the array having top and bottom portions, the thermally conductive base plate is attached to the array such that the thermally conductive base plate is in close proximity to the bottom portion, the top and bottom portions of the array extend outwardly from the thermally conductive base plate, the top portion of the array extends laterally further beyond the bottom portion of the array, and the top and bottom portions of the array and the integrated circuit device are in close proximity to the components printed circuit board.

2. The system of claim 1, wherein the top and bottom portions extend outwardly from the thermally conductive base plate comprises:
    the top and bottom portions extend outwardly in a vertical direction from the thermally conductive base plate.

3. The system of claim 2, wherein the top portion of the array extends laterally further beyond the bottom portion of the array comprises:
    the top portion of the array extends laterally in a horizontal direction further beyond the bottom portion of the array.

4. The system of claim 3, wherein the heat dissipation system has a shape selected from the group consisting of a square and a rectangle.

5. The system of claim 3, wherein the top portion of the array extends laterally in a horizontal direction further beyond the bottom portion of the array comprises:
    top portion of the array includes laterally extending top portions that are disposed across from each other.

6. The system of claim 5, wherein the integrated circuit device is a device selected from the group consisting of a microprocessor, an application-specific integrated circuit, and a digital signal processor.

7. The system of claim 6, wherein the heat dissipation system is made from materials selected from the group consisting of aluminum, copper, or other such materials that are capable of dissipating heat away from an integrated circuit device.

8. The device of claim 1, wherein the top portion of the array further extends laterally beyond the bottom portion of the array comprises:
    the laterally extending top portion overhangs from the bottom portion allow the components to encroach on the integrated circuit device.

9. The device of claim 8, wherein the top and bottom portions do not mechanically interfere with the components placed around the integrated circuit device.

10. The device of claim 8, wherein the overhang comprises overhanging regions that are disposed across from each other.

11. The device of claim 10, wherein the top and bottom portions of the array have first and second lengths, wherein the first and second lengths in a vertical direction encroach around the integrated circuit device and below the top portion of the array.

12. The device of claim 11, wherein the top portion of the array extends laterally beyond the bottom portion of the array comprises:
    the top portion of the array extends laterally, upwardly, and angularly.

* * * * *